United States Patent
McCulloch et al.

(10) Patent No.: US 6,486,398 B1
(45) Date of Patent: Nov. 26, 2002

(54) SEALING ARRANGEMENT FOR AN ELECTRONIC CIRCUIT MODULE

(75) Inventors: Andrew McCulloch, Hitchin (GB); Roger Humphreys, Felixtowe (GB)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/530,486

(22) PCT Filed: Nov. 2, 1998

(86) PCT No.: PCT/EP98/07019

§ 371 (c)(1), (2), (4) Date: Mar. 26, 2001

(87) PCT Pub. No.: WO99/23861

PCT Pub. Date: May 14, 1999

(30) Foreign Application Priority Data

Nov. 1, 1997 (GB) .............................................. 9722996

(51) Int. Cl.$^7$ ................................................ H05K 5/00
(52) U.S. Cl. ....................... 174/52.3; 361/746; 257/702; 257/787
(58) Field of Search ............................. 174/52.1, 52.2, 174/52.3; 361/728, 746; 257/702, 787, 788, 795

(56) References Cited

U.S. PATENT DOCUMENTS

| 3,987,258 | A | * | 10/1976 | Tsutsui et al. | ............... | 181/149 |
| 5,187,746 | A | * | 2/1993 | Narisawa | ..................... | 381/322 |
| 5,222,050 | A | * | 6/1993 | Marren et al. | ............... | 367/163 |
| 6,035,569 | A | * | 3/2000 | Nagel et al. | .................. | 40/651 |

FOREIGN PATENT DOCUMENTS

| EP | 0 113 073 A1 | 7/1984 |
| EP | 0 377 067 A1 | 11/1990 |

* cited by examiner

Primary Examiner—Dean A. Reichard
Assistant Examiner—W. David Walkenhorst

(57) ABSTRACT

A sealing arrangement is provided for sealing an orifice between an interior and an exterior surface of an electronic module. An air-permeable, water-impermeable membrane is disposed in the orifice. A portion of the exterior surface is provided with at least one surface channel which extends between the orifice and a distant point. A protective cover is attached to the exterior surface and arranged to overlie the membrane disposed about the orifice but not to overlie the distant point, thereby providing an air path to the interior surface of the module, via the surface channel and the membrane.

5 Claims, 5 Drawing Sheets

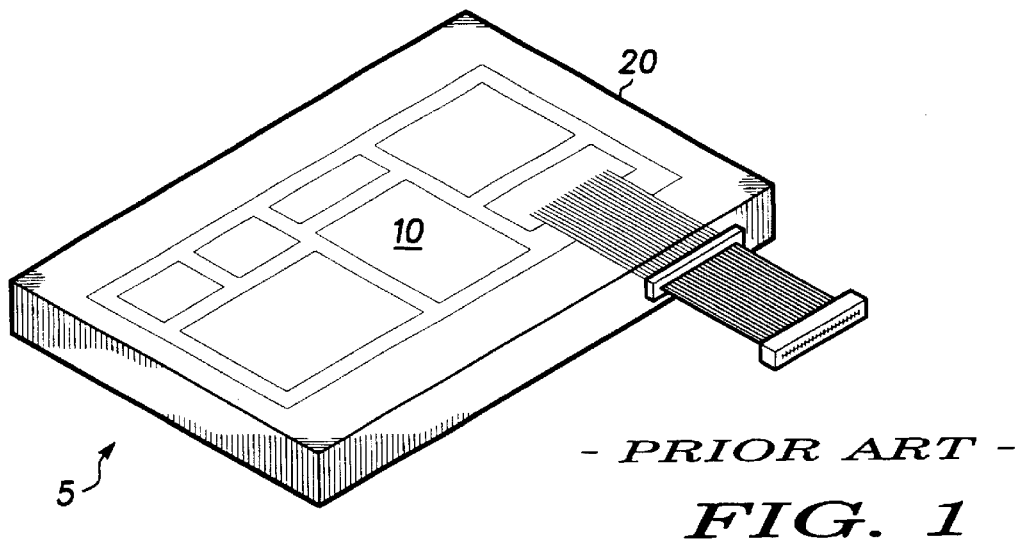
— PRIOR ART —
FIG. 1
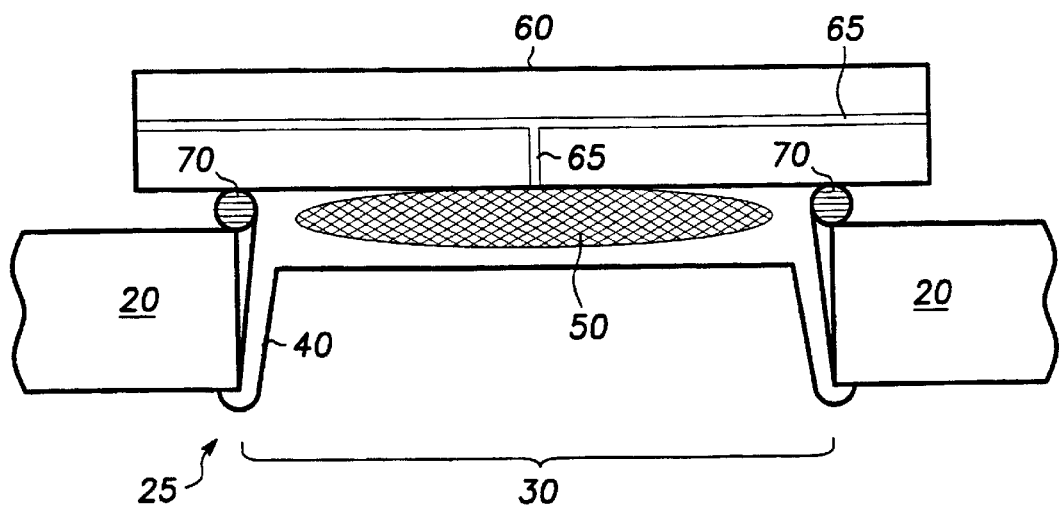
FIG. 2 — PRIOR ART —

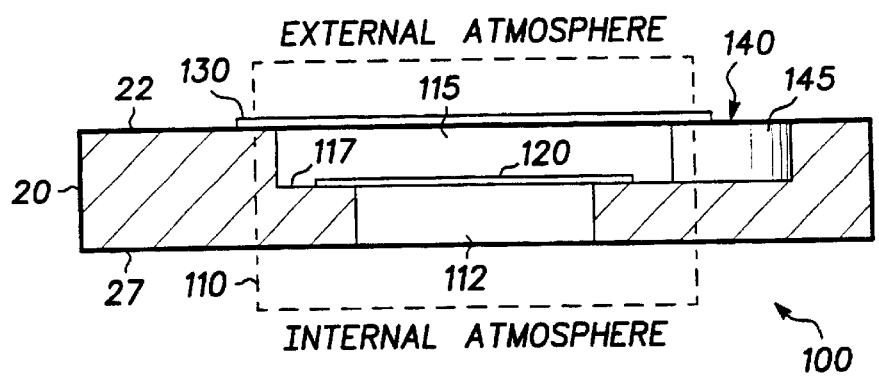
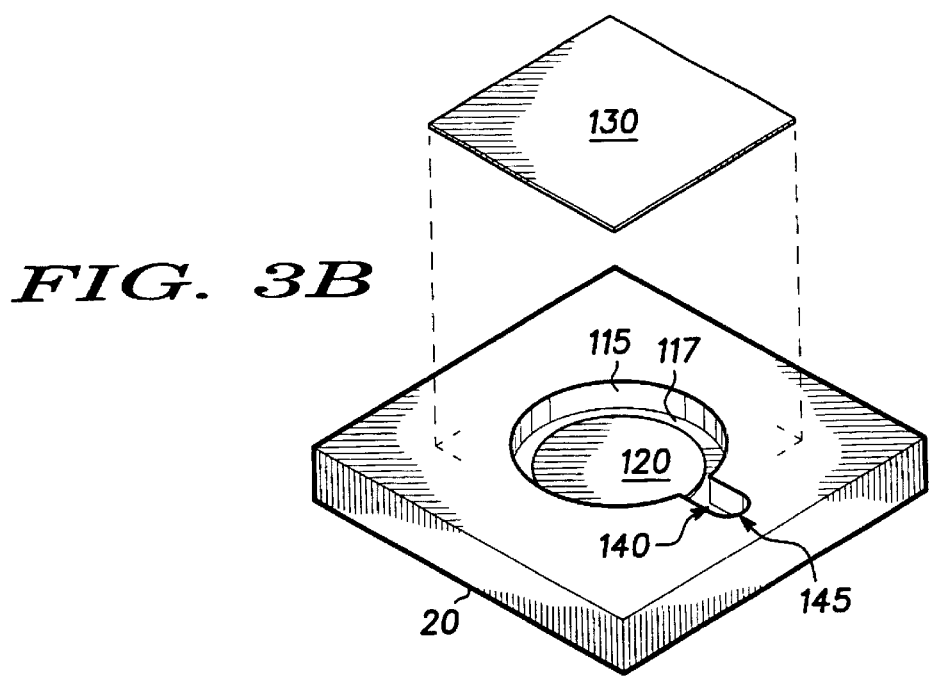
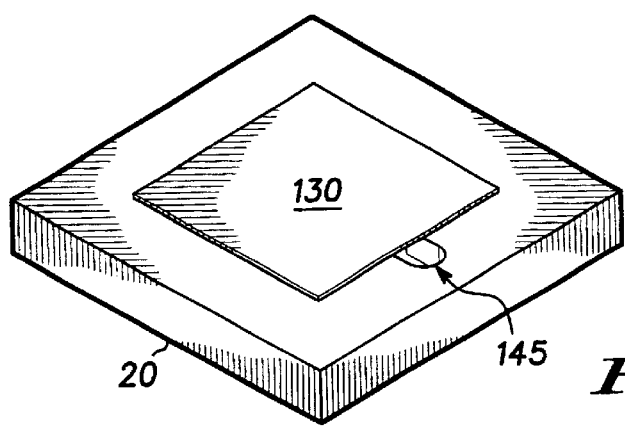

SEALING ARRANGEMENT FOR AN ELECTRONIC CIRCUIT MODULE

FIELD OF THE INVENTION

This invention relates to sealing arrangements for electronic circuit modules, and particularly but not exclusively to sealing arrangements for electronic circuit modules for use in automotive applications.

BACKGROUND OF THE INVENTION

In the automotive industry, electronic circuits are used in many applications within vehicles. For example, electronic circuits are now used in the field of engine management control, where a microprocessor is programmed to receive inputs from sensors and then provides instructions to various transducers for optimising variable engine parameters.

In such an application, and referring to FIG. 1, there is shown a module 5, which is often located in close proximity to the engine (not shown). Electronic circuitry 10 of the module 5 is typically housed in a casing 20, to protect delicate components of the circuitry 10 from oil, grease, water and extremes of temperature.

A problem with this arrangement is that the casing should be watertight, but in order to prevent an air pressure differential from building up the casing should also be air-permeable.

It is known to provide a breather device, such as a dedicated vent 25 as shown in FIG. 2. A typical vent may comprise a hole 30 formed in the casing 20 with a carrier piece 40 disposed in the hole 30 and containing an air-permeable membrane 50. An o-ring seal 70 is provided to seal the space between the carrier piece 40 and the casing 20. An intricate covering piece 60 overlies the membrane (in order to protect against clogging of the membrane by oil and grease) but at the same time has a network of small channels 65 which facilitate movement of air through the covering piece 60, so as to provide the vent.

However the manufacture of the above vent 25, including the provision of a breather hole 30 in the casing 20, the carrier piece 40 for the membrane which is disposed in the hole (with the seal 70), the complex protective covering piece 60 (with the channels 65) which must be secured to the encapsulating piece, adds further expense, time and complexity to the overall manufacture of the module 20.

This invention seeks to provide a sealing arrangement for an electronic circuit module which mitigates the above mentioned disadvantages.

SUMMARY OF THE INVENTION

According to a first aspect of the present invention there is provided a sealing arrangement for an electronic circuit module as claimed in claim 1.

In this way a seal is provided using an air-permeable, water-impermeable membrane in a simple and inexpensive arrangement, which protects the membrane from damage.

BRIEF DESCRIPTION OF THE DRAWINGS

An exemplary embodiment of the invention will now be described with reference to the drawings in which:

FIG. 1 shows a prior art electronic circuit module.

FIG. 2 shows a prior art breather device forming part of the electronic circuit module of FIG. 1.

FIGS. 3A–3C show a preferred embodiment of a sealing arrangement for an electronic circuit module in accordance with a first aspect of the invention.

DETAILED DESCRIPTION OF A PREFERRED EMBODIMENT

Figure 4A:
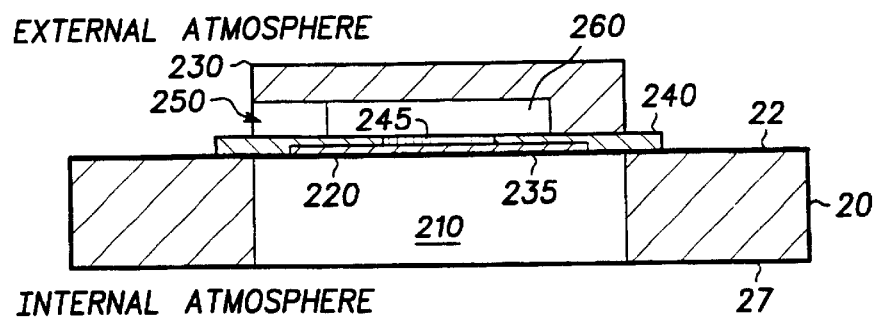
FIGS. 4A–4D show an alternative embodiment of a sealing arrangement for an electronic circuit module in accordance with a second aspect of the invention.

Referring to FIG. 1, there is shown an electronic module 10, which includes a casing 20 and electronic circuitry 30. The module 10 may be used in an automotive application, such as engine management.

Referring now also to FIGS. 3A–3C, there is shown a sealing arrangement 100, comprising a section of the module casing 20, an orifice 110, an air-permeable, water impermeable membrane 120 and a protective covering member 130.

The orifice 110 extends from an upper surface 22 of the casing 20 to a lower surface 27 of the casing 20. The upper surface 22 faces the exterior of the module 10 and the lower surface faces the interior of the module, where the electronic circuitry is located. The orifice 110 has an upper chamber 115, and a lower chamber 112. The upper chamber 115 is of a larger diameter than the lower chamber 112, such that a surface 117 is provided, between the upper and lower surfaces 22 and 27 of the casing 20.

An air-permeable, water impermeable membrane 120, such as Gore-Tex* material is attached to the surface 117, such that the lower chamber 112 is completely covered by the membrane 120. A channel 140 is provided in the upper surface 22 of the casing 20. The channel 140 extends from the upper chamber 115 of the orifice 110, along the upper surface 22 to an extremity 145 which is remote from the upper chamber 115.

*Gore-Tex is a trademark of W. L. Gore

A protective covering member 130, such as a self-adhesion label (for example, a label on which is printed information concerning the module), is arranged to cover the upper chamber 115 of the orifice 110. The protective covering member 130 does not cover the extremity 145.

In this way the membrane 120 provides pressure equalisation between the interior and exterior of the module 10. The membrane 120 is protected from foreign matter such as oil, dirt and grease, by the provision of the protective covering member 130.

Figure 4B:
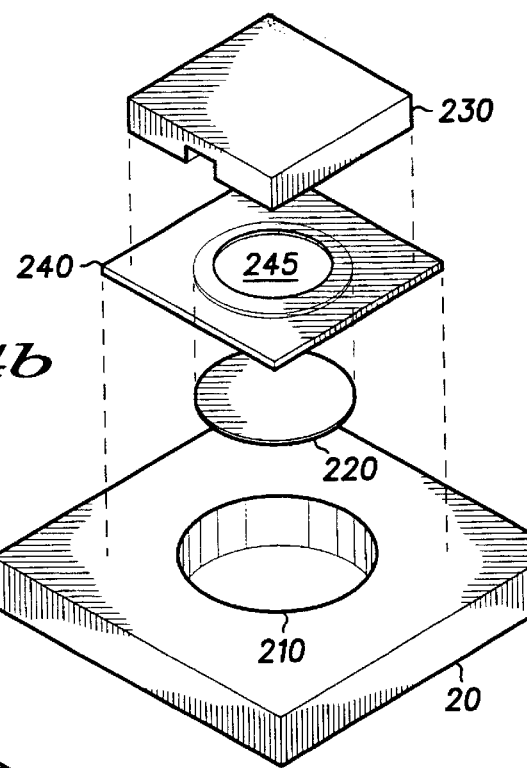
Figure 4C:
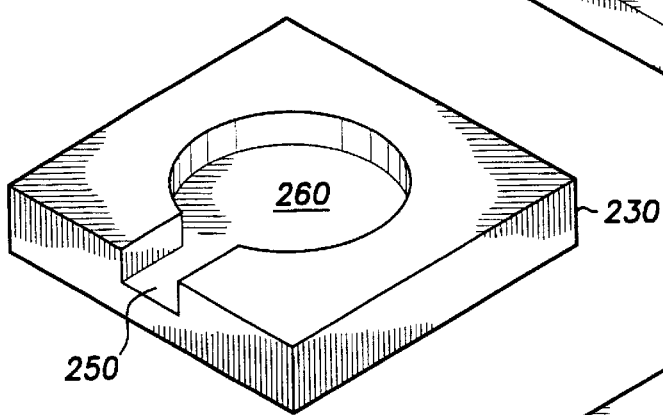
Figure 4D:
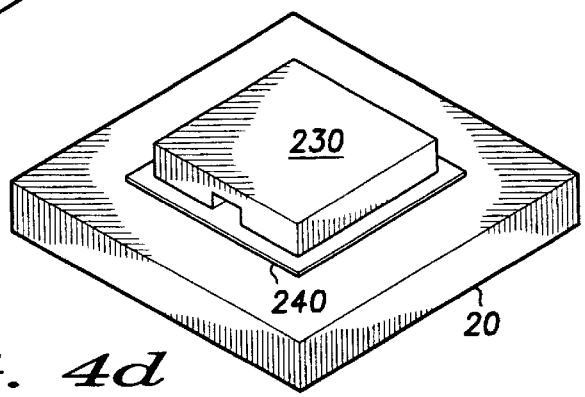

Referring now also to FIGS. 4A–4D, there is shown an alternate sealing arrangement comprising a section of the module casing 20, on orifice 210, an air-permeable, water impermeable membrane 220, a protective covering member 230, and a sealing gasket 240.

The orifice 210 extends from the upper surface 22 of the casing 20 to the lower surface 27 of the casing 20. The sealing gasket 240 has a first side arranged to face the casing 20, and a second side arranged to face away from the casing 20. The first and the second sides contain self-adhesive material. An orifice 245 is formed in the sealing gasket 240, which extends between the first and the second sides. An air-permeable, water impermeable membrane 220 is disposed in a recess 235 formed in the second side, and is arranged to completely cover the orifice 210.

A protective covering member 230 is arranged to cover the sealing gasket 240. A channel 250 and a recess 260 are provided in the side of the protective covering member 230 which faces the sealing gasket 240. The channel 250 extends from the recess 260 to an extremity at an edge of the protective covering member 230. The recess 260 and channel 250 provide an air path between the membrane 220 and the exterior of the casing 20.

In this way, as above, the membrane 220 provides pressure equalisation between the interior and exterior of the module 10, and the membrane 220 is protected from foreign matter such as oil, dirt and grease, by the provision of the protective covering member 230 and the channel and recess 250 and 260.

Figure 5A:
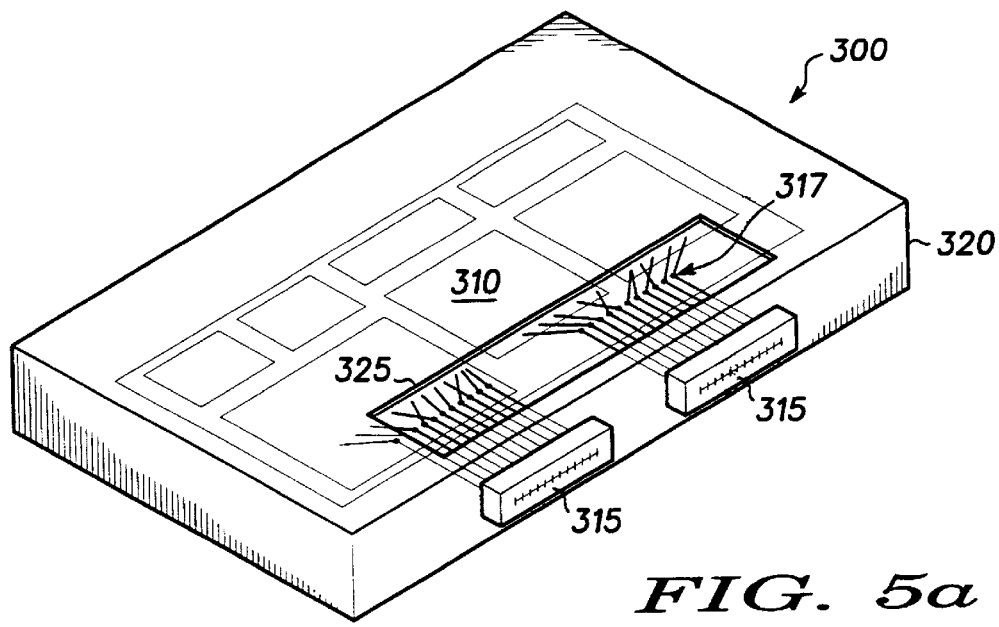
FIGS. 5A–5D show a further alternative embodiment of a sealing arrangement for an electronic circuit module in accordance with a third aspect of the invention.
Figure 5B:
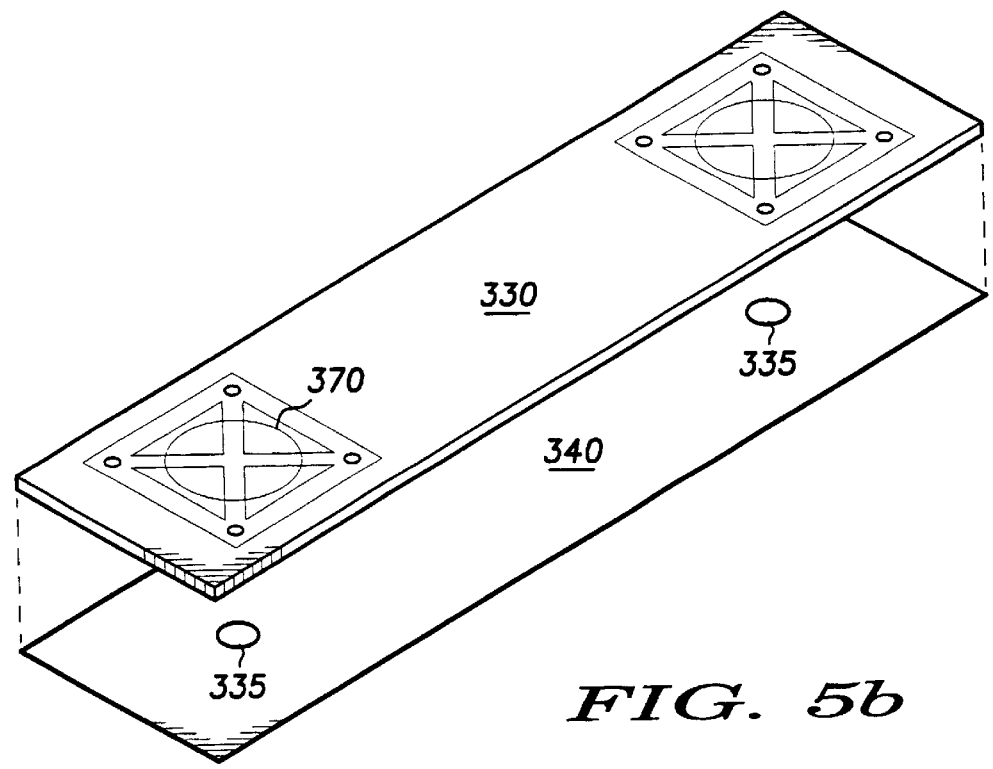
Figure 5C:
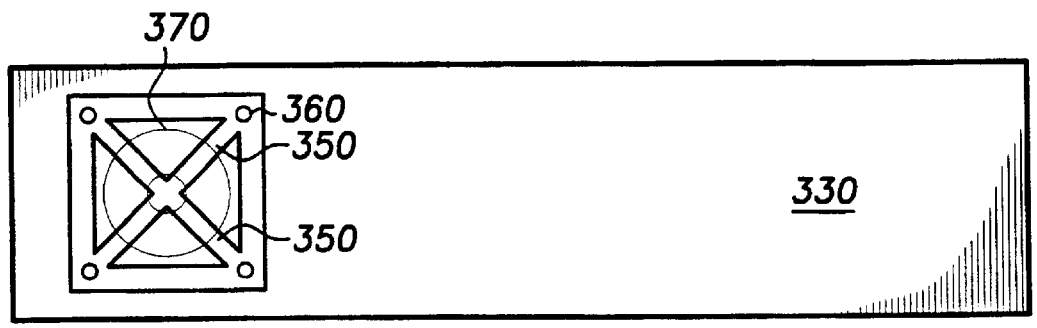
Figure 5D:
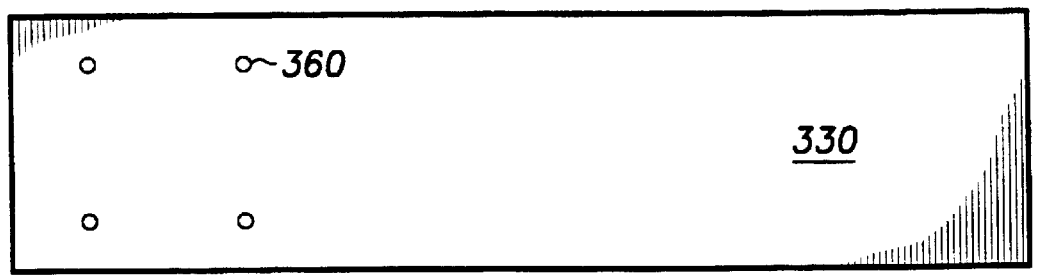

Referring now also to FIGS. 5A–5D, there is shown a further example of a sealing arrangement, applied to a module 300. Connectors 315 are provided at the exterior of the module 300, attached to the module casing 320 and arranged to provide a connection between the module 300 and other devices (not shown).

Electronic circuitry 310 of the module 300 is coupled to the connectors 315 via soldered joints 317, which are soldered after the module 300 has been assembled. In order to facilitate soldering of the joints 317, an orifice 325 is provided in the casing 320. Once the joints 317 have been soldered, the orifice 325 must be sealed. This is achieved using a covering plate 330 and a sealing gasket 340.

The sealing gasket 330 has two small orifices 335, and is arranged provide a seal between the orifice 325 of the casing 320 and the covering plate 330.

The covering plate 330 has a network of channels 350 which are provided in the underside of the protective covering member 330 which faces the sealing gasket 340. At the centre of the network of channels, there is a recess 370, in which an air-permeable water-impermeable membrane is fitted. Each channel of the network 350 extends from the recess 370 to a hole 360. The holes 360 extend through from the underside of the covering plate 330 to a topside. The holes 360 and channel network 350 provide an air path between the recess 370 and the exterior of the casing 320.

In this way, as above, the membrane provides pressure equalisation between the interior and exterior of the module 300, and the membrane is protected from foreign matter such as oil, dirt and grease, by the provision of the protective covering plate 330.

It will be appreciated that alternative embodiments to those described above are possible. For example, in the embodiment of FIGS. 3A–3C, protective cover may be provided in a form other than the self-adhesive label described above.

Furthermore in the embodiment of FIGS. 4A–4D, the membrane 220 may be directly attached to the second side of the sealing gasket 240, rather than being disposed in the recess 235. The sealing gasket 240 may contain self-adhesive material on only one side.

What is claimed is:

1. A sealing arrangement for an electronic module, the sealing arrangement comprising:

a section of a casing for the electronic module, the section of the casing having an orifice that extends from an upper surface of the casing to a lower surface of the casing, the upper surface of the casing facing an exterior of the electronic module, the lower surface facing an interior of the electronic module, the orifice having an upper chamber and a lower chamber, the upper chamber being larger in diameter than the lower chamber and defining an intermediate surface in the section of casing between the upper surface and the lower surface;

an air-permeable, water-impermeable membrane, disposed in the orifice and attached to the intermediate surface in the section of casing;

at least one surface channel, formed in the upper surface of the casing and extending from the upper chamber of the orifice to an extremity that is remote from the upper chamber;

a protective cover, attached to the upper surface of the casing, and arranged to overlie the upper chamber of the orifice and the membrane disposed in the orifice, such that the channel extending from the upper chamber of the orifice to the extremity provides an air path to the interior of the electronic module, via the membrane.

2. The sealing arrangement of claim 1 wherein the protective cover is a self adhesive label.

3. A sealing arrangement for an electronic module, the sealing arrangement comprising:

a section of a casing for the electronic module, the section of the module having an orifice that extends from an upper surface of the casing to a lower surface of the casing, the upper surface of the casing facing an exterior of the electronic module, the lower surface facing an interior of the electronic module;

a relatively flat sealing gasket having a first side arranged to face and attach to the upper surface of the casing and a second side arranged to face away from the upper surface of the casing;

an air-permeable, water-impermeable membrane, disposed in the relatively flat sealing gasket which covers the orifice;

a protective cover arranged for covering and attaching to the relatively flat sealing gasket, the protective cover having a channel and a recess that are arranged to face the gasket, the channel and recess providing an air path to the interior of the electronic module, via the membrane.

4. The sealing arrangement of claim 3 wherein the air-permeable, water-impermeable membrane, is disposed in a recess formed in the sealing gasket.

5. The sealing arrangement of claim 3 or claim 4 wherein the sealing gasket has first and second sides which contain self-adhesive material.

* * * * *